United States Patent
Flynn et al.

(10) Patent No.: US 7,863,778 B2
(45) Date of Patent: Jan. 4, 2011

(54) POWER CONTROLLING INTEGRATED CIRCUIT CELL

(75) Inventors: David Walter Flynn, Cambridge (GB); David William Howard, Cambridge (GB); Dhrumil Gandhi, Cupertino, CA (US); John Philip Biggs, Teversham (GB)

(73) Assignee: ARM Limited, Cambridge (GB)

( * ) Notice: Subject to any disclaimer, the term of this patent is extended or adjusted under 35 U.S.C. 154(b) by 381 days.

(21) Appl. No.: 11/920,364

(22) PCT Filed: Jul. 25, 2005

(86) PCT No.: PCT/GB2005/002902

§ 371 (c)(1),
(2), (4) Date: Nov. 14, 2007

(87) PCT Pub. No.: WO2007/012788

PCT Pub. Date: Feb. 1, 2007

(65) Prior Publication Data

US 2009/0066164 A1    Mar. 12, 2009

(51) Int. Cl.
*H01H 9/54* (2006.01)
*G06F 1/00* (2006.01)
(52) U.S. Cl. .................................. 307/140; 713/330
(58) Field of Classification Search .............. 307/140; 713/324, 330
See application file for complete search history.

(56) References Cited

U.S. PATENT DOCUMENTS

2004/0263237 A1    12/2004   Kim et al.

OTHER PUBLICATIONS

Royannez Pet al: "90nm low leakage SoC design techniques for wireless applications" Solid-State Circuits Conference, 2005. Digest of Technical Papers. ISSCC. 2005 IEEE International San Francisco, CA, USA Feb. 6-10, 2005, Piscataway, N J, USA,IEEE, Feb. 6, 2005, pp. 138-140.*
Ling, "Damned If You Do," *New Electronics, Northwood Publications*, 2005, pp. 27-28.
International Search Report for International Application No. PCT/GB2005/002902 mailed Jun. 1, 2006.

* cited by examiner

*Primary Examiner*—Michael Rutland Wallis
(74) *Attorney, Agent, or Firm*—Nixon & Vanderhye P.C.

(57) ABSTRACT

A power controlling integrated circuit cell is provided within an integrated circuit power grid to selectively couple an unswitched power supply input to a switched power supply output. The power controlling integrated circuit cell also includes a power control signal input and a power control signal output for supporting the distribution through the integrated circuit of the power control signal. The power controlling integrated circuit cell has a power switching circuit responsive to a power control input signal received at the power control signal input to selectively connect the switched power supply output to the unswitched power supply input, and a power control signal buffer circuit responsive to the switched power supply output to drive a power control output signal from the power control signal output.

37 Claims, 5 Drawing Sheets

Switch with isolation gate functionality

Switch with additional control-net buffer

POWER CONTROLLING INTEGRATED CIRCUIT CELL

This application is the U.S. national phase of International Application No. PCT/GB2005/002902, filed 25 Jul. 2005, which designated the U.S. The entire contents of that application is hereby incorporated by reference.

This invention relates to the field of integrated circuits. More particularly, this invention relates to integrated circuit cells, which are building blocks from which integrated circuits are formed.

It is known to provide integrated circuit cells which provide predetermined functions and from which a complete integrated circuit can be formed. The designs of these cells are typically part of a cell library and computerised tools select and place the appropriate cells within an overall integrated circuit design to achieve a specified functionality. As integrated circuits become more complex, the number of integrated circuit cells for forming those integrated circuits is rapidly increasing and the task of placing and routing the signals within the integrated circuit becomes more difficult.

Another trend within integrated circuit design is the reduction in physical size of the semiconductor components which make up the integrated circuit cells. There has also been a trend towards the use of lower threshold voltage elements as these may be made to switch more rapidly. These trends have increased the power consumption of integrated circuits in a disadvantageous way, particularly due to an increase in leakage current. In order to address this disadvantageous increase in power consumption, techniques have been proposed and used to isolate portions of the integrated circuit from the power supplies when those portions are not required to be used. This can reduce the leakage current through those portions. Associated techniques may also be provided which serve to save any state within a portion of an integrated circuit which is to be powered down prior to that power down such that the state can be restored at a later time without being lost. Such state retention mechanisms sometimes use so called "balloon latches". Another associated technique is to use isolation gates between elements within the design to prevent floating inputs or outputs arising when portions of the integrated circuit are powered down which could otherwise result in unpredictable or incorrect operation elsewhere.

Figure 1:
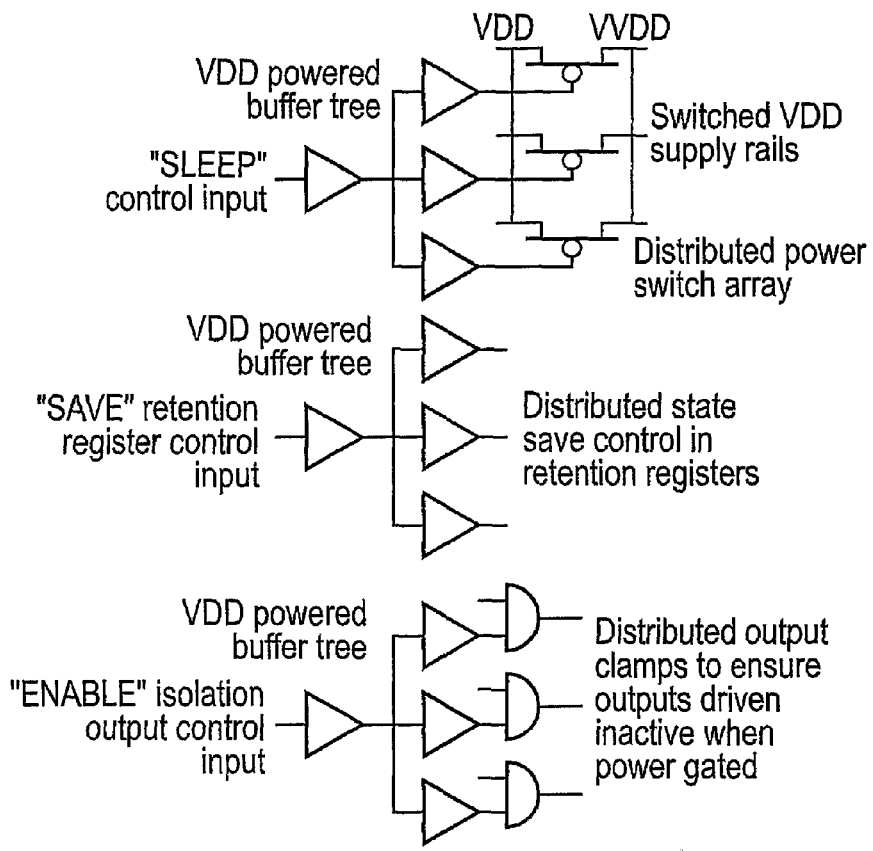

Whilst the above described techniques can be effective in reducing leakage current, they have an associated overhead in terms of both the circuit elements needed to support this additional functionality, circuit complexity and control routing in particular. FIG. 1 of the accompanying drawings schematically illustrates control circuit elements which may be additionally provided within an integrated circuit design to support the above described "sleep", "save" and "enable" type of operations. These control signals need to be widely routed across the integrated circuit design and also include buffer elements which require a permanent power supply such that these buffers can continue to drive the required control signals even when the power supplies to the circuit elements they are associated with have been switched off.

The provision of such power controlling mechanisms will thus be seen to address one set of problems but itself to introduce a new set of complexities and overhead. A particular problem which can arise is disadvantageous power surges when multiple portions of an integrated circuit are powered back up. In order to reduce the likelihood of such spikes in the power requirement careful and time-consuming design of the distribution of the power control signals is required. The routing of the power control signals so as to meet these timing requirements can represent a challenge both to an engineer and the design tools.

The article "The practice of power gating comes with its own problems" by Philip Lang in New Electronics, 10 May 2005, pages 27-28, describes a power switch design which uses a two pass turn on mechanism. Each power switch comprises weak and strong transistors, in a first pass the weak transistors of each power switch being turned on, and then an acknowledgement signal being used in a second pass to turn on the strong transistors of each power switch. Such an approach reduces peak current in each power switch through the use of weak and strong transistors which are turned on at different times, and hence alleviates to some extent the earlier mentioned problem of power requirement surges occurring when multiple portions of an integrated circuit are powered back up. However, there is still a considerable overall peak current due to the weak transistors of each power switch being turned on in rapid succession, as a result of which many weak transistors are likely to be switched on at the same time.

Accordingly, it would be desirable to provide an improved technique for reducing power surges when employing power controlling mechanisms in integrated circuits.

Viewed from one aspect the present invention provides a power controlling integrated circuit cell for forming part of an integrated circuit and having an unswitched power supply input, a switched power supply output, a power control signal input and a power control signal output, said power controlling integrated circuit cell comprising:

a power switching circuit responsive to a power control input signal received at said power control signal input to selectively connect said switched power supply output to said unswitched power supply input; and a power control signal buffer circuit at least partially powered from said unswitched power supply input and responsive to said switched power supply output to drive a power control output signal from said power control signal output.

The present technique recognises that the distribution of power control signals may be supported by the provision of power controlling integrated circuit cells which include a power control signal input and a power control signal output together with a power control signal buffer circuit. The power controlling integrated circuit cell includes a power switching circuit which selectively connects a switched power supply line to an unswitched power supply line and accordingly provides physical proximity to the unswitched power supply line allowing the power control signal buffer circuit conveniently to derive its permanently live power supply as required. By arranging the power control signal buffer circuit to be responsive to the switched power supply output to drive the power control output signal from the power control signal output, a significant delay is introduced between the power control input signal causing the power switching circuit to connect the switched power supply output to the unswitched power supply input, and the power control signal buffer circuit propagating that power control signal as the output power control signal. When connected with other power controlling integrated circuit cells, this can significantly reduce peak current and hence reduce power surges.

These power controlling integrated circuit cells can be placed within the overall integrated circuit design to selectively isolate portions of the integrated circuit from the power supply so as to reduce leakage current whilst simultaneously providing an infrastructure for the distribution of the associated power control signals.

The power switching circuit can be arranged in a variety of ways. In one embodiment, the power switching circuit comprises first and second parallel switch elements, the first switch element being responsive to the power control input signal to selectively connect said switched power supply output to said unswitched power supply input, and the second switch element being responsive to the power control output signal to selectively connect said switched power supply output to said unswitched power supply input. Hence, within each power controlling integrated circuit cell, the charging of switched power supply output can take place in two distinct phases, thereby reducing peak current consumption. Further, if a plurality of such power controlling integrated circuit cells are connected in series, the power control signal buffer circuit of preferred embodiments ensures that one cell has almost completed its charging of the switched power supply output before the next cell begins its charging process, thereby further reducing peak current consumption In one embodiment, the connection of said switched power supply output to said unswitched power supply input by the power switching circuit will cause the voltage of the switched power supply output to transition over a period of time, and the power control signal buffer circuit is operable to produce a digital transition in the value of the power control output signal when the transitioning voltage of the switched power supply output reaches a predetermined voltage value. In one embodiment this is achieved by providing Schmitt trigger logic within the power control signal buffer circuit. In one particular embodiment, the first switch element is weaker than the second switch element, and when the first switch element is activated this causes a relatively slow transition of the switched power supply output voltage. Through use of the above embodiment, a clear digital transition in the value of the power control output signal can be achieved even though the switched power supply output voltage is only transitioning slowly.

As well as distributing a power control signal to switch the power supply, the power controlling integrated circuit cell may also distribute further control signals which may advantageously be associated with the power control behaviour, and which typically must be driven when the switched power supply output is not connected to the unswitched power supply input, examples of such further control signals being a save signal, a restore signal and an input/output enable signal. These further control signals may in one embodiment be independently generated and distributed throughout the integrated circuit via the power controlling integrated circuit cells. In one embodiment, the power control signal buffer circuit is operable in dependence on an enable signal, and the further control signal buffer is also operable to receive said enable signal and is responsive to the enable signal being de-asserted to isolate the further control signal output.

The power control signal input and outputs of the power controlling integrated circuit cells may be linked together in a variety of ways such as via abutment when the inputs and outputs are appropriately disposed on the outer edge of the cells or via linking conductors from the predetermined input and output positions within the cells.

Viewed from another aspect the present invention provides an integrated circuit comprising:

a plurality of integrated circuit cells;

a plurality of unswitched power supply lines;

a plurality of switched power supply lines; and a plurality of power controlling integrated circuit cells, at least one of said power controlling integrated circuit cells having an unswitched power supply input, a switched power supply output, a power control signal input and a power control signal output and comprising:

a power switching circuit responsive to a power control input signal received at said power control signal input to selectively connect said switched power supply output to said unswitched power supply input; and a power control signal buffer circuit at least partially powered from said unswitched power supply input and responsive to said switched power supply output to drive a power control output signal from said power control signal output;

wherein for at least some of said plurality of power controlling integrated circuit cells:

said unswitched power supply input is connected to one of said plurality of unswitched power supply lines;

said switched power supply output is connected to one of said plurality of switched power supply lines; and a power control signal output of a given power controlling integrated circuit cell is connected to a power control signal input of another power controlling integrated circuit cell to provide a propagation path for a power control signal through said integrated circuit.

It will be appreciated that the propagation paths for the power control signals and the further control signals could take a wide variety of different forms but are conveniently formed to have a fan-out topology or a daisy-chained topology for at least portions of their propagation paths. These topologies may also be mixed.

When a power control signal reaches an end of its propagation path it may conveniently be used to generate a power control acknowledge signal which is fed back to the source of the power control signal to indicate that it has completed its transit through the integrated circuit and accordingly it can be assumed that appropriate responses have now taken place to that power control signal. This is useful in sequencing what are becoming more complex power up and power down operations, such as may include save, restore, isolate and enable actions in addition to the switching of the power supply itself. These actions have to be appropriately timed relative to each other.

Viewed from another aspect the present invention provides a computer implemented method of designing an integrated circuit comprising the steps of:

defining a power grid including a plurality of unswitched power supply lines and a plurality of switched power supply lines;

locating a plurality of power controlling integrated circuit cells within said power grid, said plurality of power controlling integrated circuit cells having an unswitched power supply input, a switched power supply output, a power control signal input and a power control signal output, a power controlling integrated circuit cell comprising:

a power switching circuit responsive to a power control input signal received at said power control signal input to selectively connect said switched power supply output to said unswitched power supply input; and a power control signal buffer circuit at least partially powered from said unswitched power supply input and responsive to said switched power supply output to drive a power control output signal from said power control signal output to provide a propagation path for a power control signal through said integrated circuit; and locating a plurality of further integrated circuit cells within said power grid, at least some portions of at least some of said further integrated circuit cells being powered from one of said plurality of switched power supply lines.

The provision of power controlling integrated circuit cells incorporating support for power control signal distribution is particularly well suited to computer implemented methods of integrated circuit design since it allows a regular and ordered power controlling infrastructure to be provided as a framework within the integrated circuit which can then be populated with other integrated circuit cells to yield the desired processing functionality. This gives a system level approach to the provision of power control within an integrated circuit in a manner which simplifies the task of the designers and the tools in supporting required power controlling functions.

A further complementary aspect of the invention is an integrated circuit cell library element defining a power controlling integrated circuit cell as previously discussed. Such integrated circuit cell libraries are used by computer implemented methods and tools as the building blocks from which complete integrated circuit designs can be formed.

Figure 2:
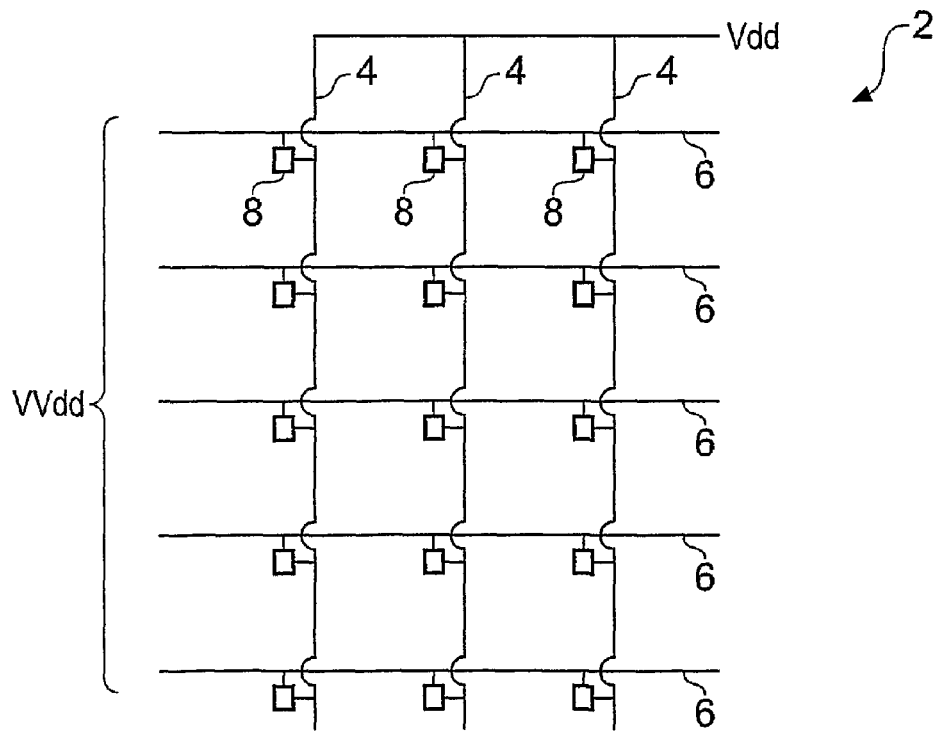
Figure 3:
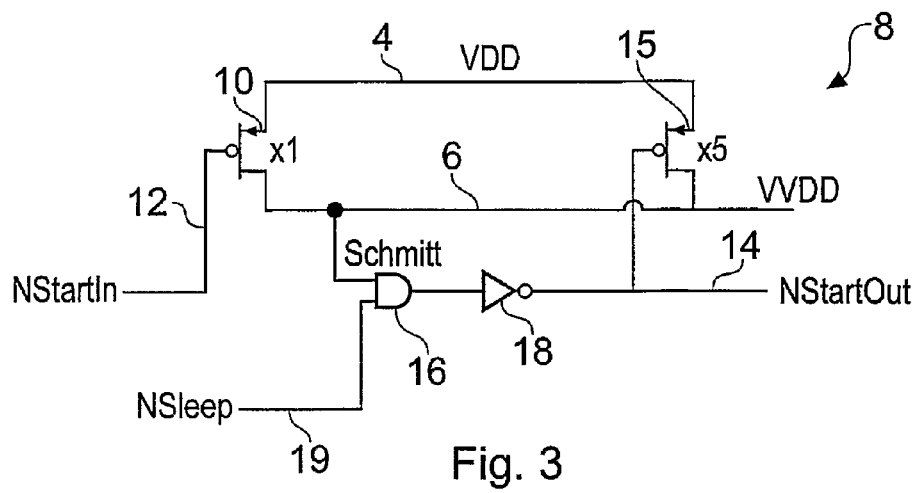
Figure 4:
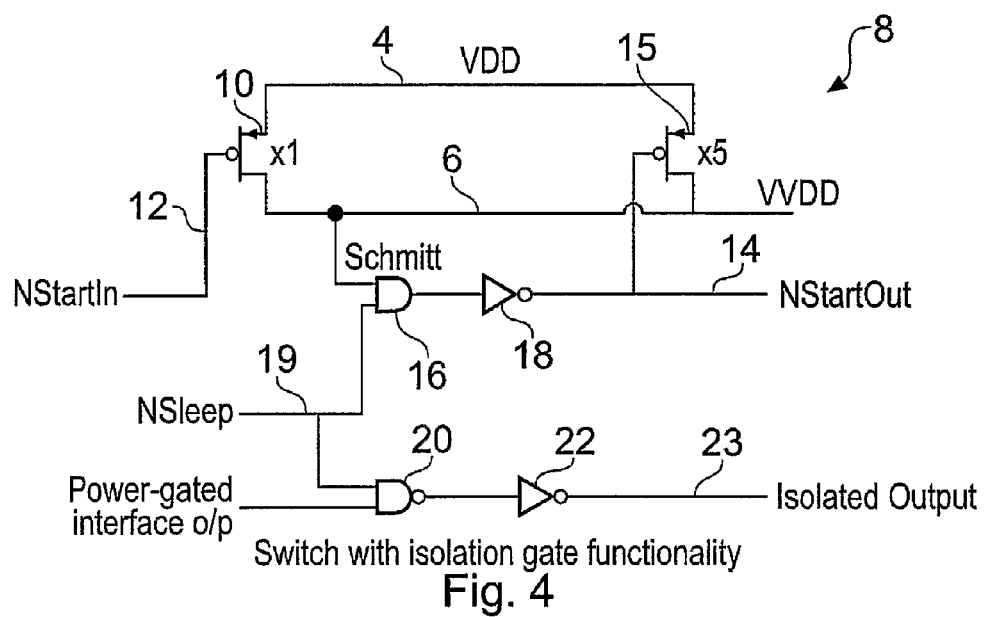
Figure 5:
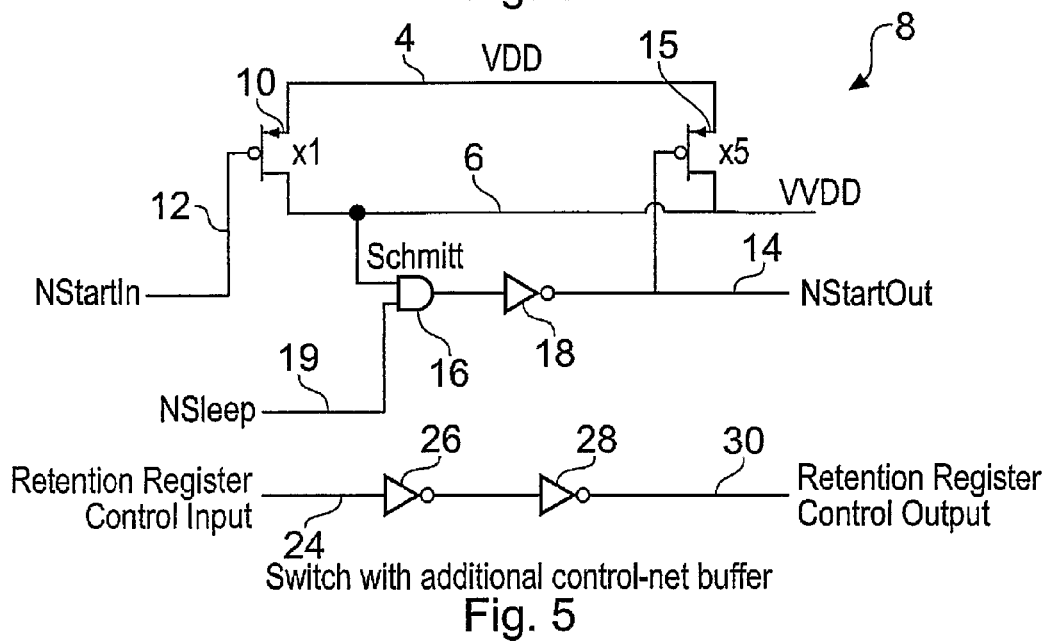
Figure 6:
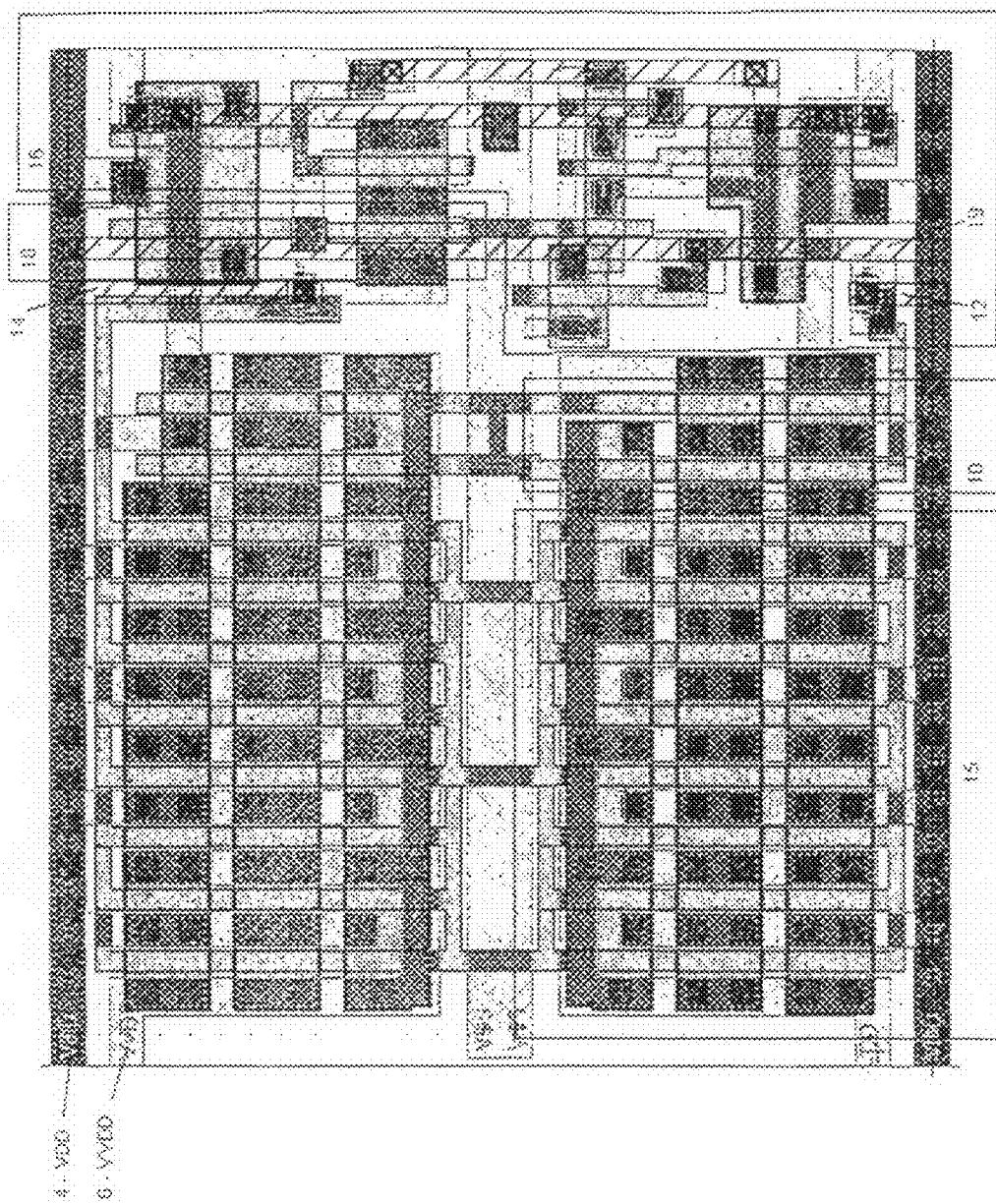
Figure 7:
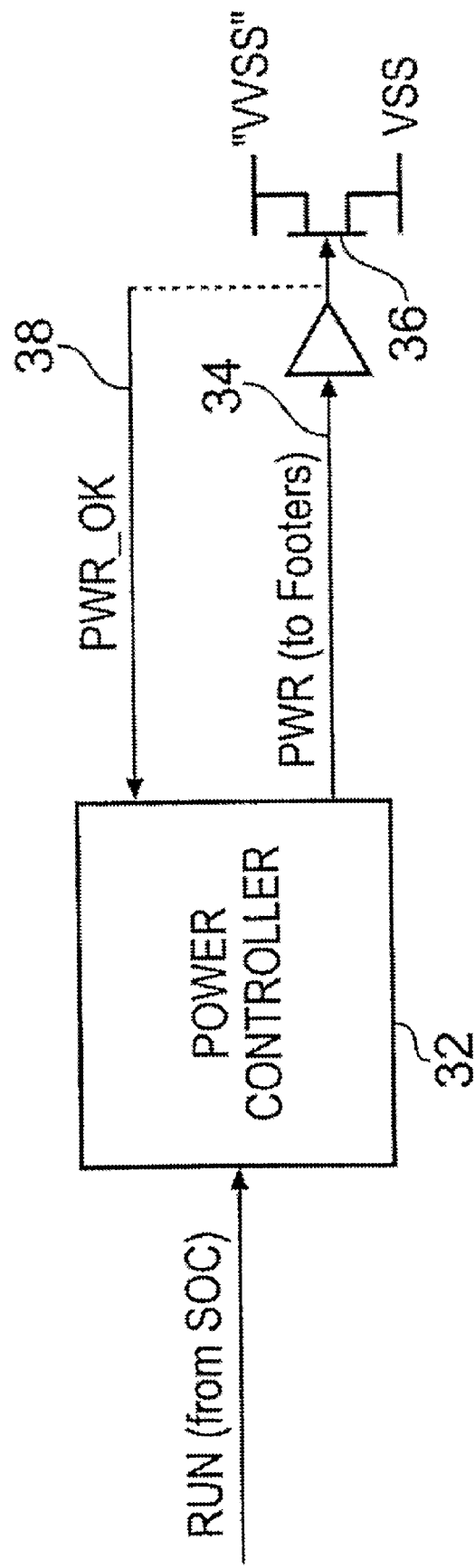
Figure 8:
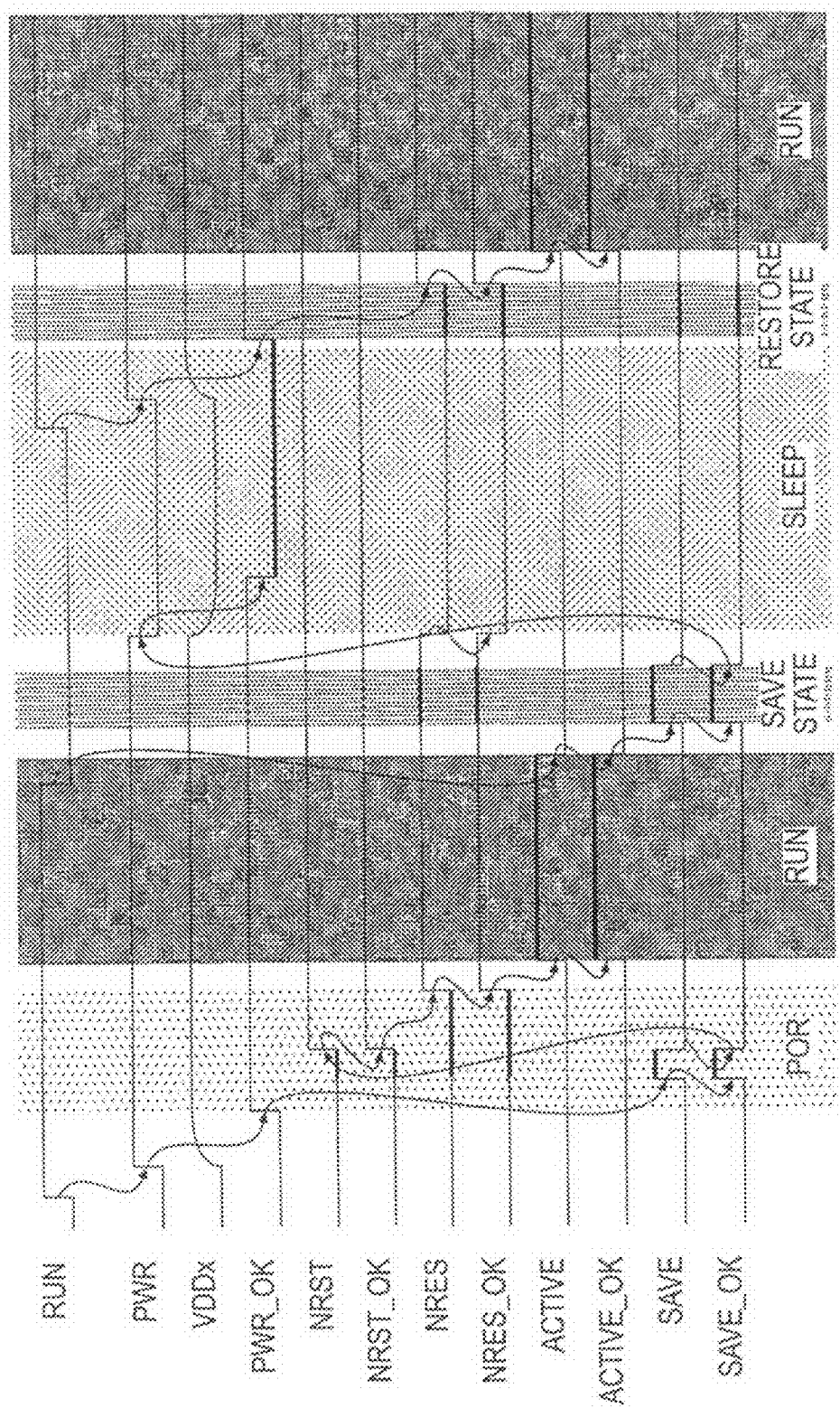

Embodiments of the present invention will now be described, by way of example only, with reference to the accompanying drawings in which:

FIG. 1 schematically illustrates power control signal and further control signal distribution networks;

FIG. 2 schematically illustrates a power grid within an integrated circuit;

FIGS. 3, 4 and 5 schematically illustrate at a functional level the circuit elements which may be provided in respective example power controlling integrated circuit cells;

FIG. 6 illustrates a circuit layout of a power controlling integrated circuit cell;

FIG. 7 schematically illustrates the generation of a power control signal and an associated power control acknowledge signal; and FIG. 8 schematically illustrates a sequence of power up and power down type operations within an integrated circuit and the timing of the associated control signals.

FIG. 2 illustrates a power grid 2 which may be provided as a framework within an integrated circuit. The power grid 2 comprises a plurality of unswitched power lines 4 running in one direction and at one layer level within the integrated circuit. Running in an orthogonal direction are a plurality of switched power lines 6. The switched power lines 6 run at a different layer level within the integrated circuit and are selectively connected to the unswitched power lines 4 via switching elements 8. These switching elements 8 are power controlling integrated circuit cells which may advantageously, although not essentially, be located underneath the unswitched power lines 4 at the intersection of the unswitched power lines 4 and the switched power lines 6. These power controlling integrated circuit cells 8 are responsive to power control signals (not illustrated in FIG. 2) to selectively connect the switched power supply lines 6 to the unswitched power supply lines 4. In this way, different portions of the integrated circuit may be powered up and powered down as desired.

It should be noted that whilst in FIG. 2 the unswitched and switched power lines are shown as running orthogonally to one another, this is not a requirement. Indeed in one embodiment the unswitched power lines may themselves be distributed in a grid on the top two metal layers.

FIG. 3 schematically illustrates the circuit elements which may be provided within one example power controlling integrated circuit cell. A power switching circuit is provided by two parallel switches 10, 15, in one embodiment one being much larger than the other. In particular, in the diagram the weaker switch is marked as "x1" and the stronger switch is marked as "x5". The switching circuit serves to selectively connect the unswitched power supply line 4 to the switched power supply line 6. A power control signal input 12 receives a power control input signal. "NstartIn", which causes only the weaker switch 10 to be turned on initially, thereby allowing only a small current to flow from VDD 4 into the switched power output VVDD 6. Only when VVDD is largely powered up is the larger main switch 15 turned on. This is controlled by a power control signal buffer circuit consisting of the AND gate 16 and the inverter 18. The output of AND gate 16 switches to a logic 1 level only when VVDD is at a voltage higher than the input threshold of this gate. When the AND output rises, signal NStartOut falls at the power control signal output 14, and the larger PMOS switch 15 turns on to quickly charge VVDD up to its final operating voltage.

The output signal NStartOut is also connected to NStartIn of the next row or subblock, so the next row will only start to power up once the current row is mostly powered up. The rows of the chip (or macro cell) are daisy-chained together so that the many rows turn on in a fixed and regular sequence.

The NSleep signal input over path 19 to AND gate 16 is a global signal supplied to all power-gating control cells which ensures that when the power switches are switched off this happens with just a few gates of delay, and does not have the same long delay as the turn-on sequence. The NStartIn of the first row will typically be driven by an inverter whose input is NSleep—i.e. it is logically NOT(NSleep).

In FIG. 3, the AND gate is formed as a Schmitt trigger, and hence has a small feedback device internally to ensure a clean switching transition from the slowly rising VVDD input.

It will be appreciated that the above described power control signals need to be buffered in order to be distributed over relatively large distances within an integrated circuit. By buffering them in the manner described above, the buffering can also introduce an advantageous delay in the propagation of the power control signal through the integrated circuit in a way which phases the power up of different portions of the integrated circuit so as to reduce the occurrence of power spikes associated with this activity. The regular and methodical distribution of the power control signals which may be achieved using the power controlling integrated circuit cells of the present technique enables patterns of distribution of the power control signals to be readily achieved whereby by an appropriate daisy-chained topology or fan-out topology connecting the power control signal inputs and outputs of differing power controlling integrated circuit cells a desired pattern and phasing of propagation of a power control signal through an integrated circuit as a whole may be achieved.

FIG. 4 illustrates another example power controlling integrated circuit cell 8, but in this example additionally including support for generation of an isolating signal for isolating outputs and inputs of other integrated circuit cell elements. In particular a NAND gate 20 is provided within the power controlling integrated circuit cell 8 with one of its inputs taken from the global signal "nSLEEP". The output from another integrated circuit cell (not shown) can be fed to the other input of this NAND gate 20 and accordingly subject to selective isolation depending upon the state of the signal "nSLEEP". The selectively isolated output is driven via inverter 22 to an isolated output 23.

FIG. 5 illustrates a further example power controlling integrated circuit cell 8, but in this example the further control signal is supported by the power controlling integrated circuit cell in its distribution but is not in itself gated by the power control signal. In the example of FIG. 5, the further control signal is a retention register control signal (a "save" signal) which is received at a further control signal input 24 and subject to buffering via inverters 26, 28 prior to being output from a further control signal output 30. This cell may also buffer the global "nSLEEP" signal.

FIG. 6 illustrates the physical form of a power controlling integrated circuit cell 8 in accordance with the example of FIGS. 3 and 6. In particular, power switching transistors 10, 15 selectively connect an unswitched power supply line 4 to a switched power supply line 6 under control of a power control signal input at a power control input 12 and output from a power control output 14. A power control signal buffer circuit 16, 18 buffers the power control signal within the power controlling integrated circuit cell 8 for further distribution and use by other power controlling integrated circuit cells 8.

FIG. 7 is a high-level illustration of how the power control signals may be controlled on a system-wide basis. At this level a request to run (power up) a portion of a system-on-chip is received and passed to a controller 32. This controller 32 then generates a power control signal 34 which is distributed via the power control signal inputs and outputs of the power controlling integrated circuit cells 8 associated with that portion of the system-on-chip integrated circuit which it is desired to power up. This, in the example of FIG. 7, selectively connects or isolates the controlled integrated circuit cells from the $V_{SS}$ line using footer power switching transistors 36. When the propagation of the power control signal 34 has reached an end of its propagation path (there may be more than one end and it may be convenient to choose the slowest path for this task), then a power control acknowledge signal 38 is generated from the power control signal reaching the end of its path and is directed back to the power controlling logic 32. This closed-loop control is advantageously reliable and self-timing in a way that simplifies and makes more reliable sequencing of power controlling events.

FIG. 8 illustrates in more detail how a sequence of power controlling events may be triggered and self-timed using these control signal propagation techniques starting from a basic "RUN" signal. At a highest level the power control signal "PWR" is distributed using the power controlling integrated circuit cells 8 through the portion of the integrated circuit being turned on and there is a resulting rise in the switched power supply voltage for that portion. An acknowledge signal of the completion of the power up is returned as signal PWR_OK. There then follows the generation of a sequence of data retention control signals "save", "reset" and "restore". Finally, an "active" signal is propagated and acknowledged. A complementary sequence of signals is generated to control the phased power down activity as is shown.

From the above description it will be appreciated that embodiments of the present invention provide power controlling integrated circuit cells that reduces the surge current which is likely to occur when the switched power supply output is first turned on. This is achieved by powering-up the rows of the chip or macro one-at-a-time rather than all at once, and also with only a small number of the pmos power switches active initially.

In particular, each power controlling integrated circuit cell has a weak transistor and a strong transistor. The weak transistor charges up VVDD gently, and only when it is well underway (typically 50% or more) does the weak transistor in the next switch in the chain get turned on due to the buffer circuit driving the power control output signal. At the same time the strong transistor of the cell is turned on to complete the precharge transition. The AND gate of the buffer circuit controls this, since it only drives its output signal high (causing NStartOut to be driven low) when it detects a high logic level on the input which is connected to VVDD. In practice there is a small overlap between one switch completing its charging and the next one starting up, but only 2 or 3 switches will be turned on and passing current at once, thereby significantly reducing power surges.

Although a particular embodiment of the invention has been described herein, it will be apparent that the invention is not limited thereto, and that many modifications and additions may be made within the scope of the invention.

The invention claimed is:

1. A power controlling integrated circuit cell for forming part of an integrated circuit and having an unswitched power supply input, a switched power supply output, a power control signal input and a power control signal output, said power controlling integrated circuit cell comprising:
   a power switching circuit responsive to a power control input signal received at said power control signal input to selectively connect said switched power supply output to said unswitched power supply input; and
   a power control signal buffer circuit at least partially powered from said unswitched power supply input and responsive to said switched power supply output to drive a power control output signal from said power control signal output.

2. A power controlling integrated circuit as claimed in claim 1, wherein the power switching circuit comprises first and second parallel switch elements, the first switch element being responsive to the power control input signal to selectively connect said switched power supply output to said unswitched power supply input, and the second switch element being responsive to the power control output signal to selectively connect said switched power supply output to said unswitched power supply input.

3. A power controlling integrated circuit as claimed in claim 1, wherein the connection of said switched power supply output to said unswitched power supply input by the power switching circuit will cause the voltage of the switched power supply output to transition over a period of time, and the power control signal buffer circuit is operable to produce a digital transition in the value of the power control output signal when the transitioning voltage of the switched power supply output reaches a predetermined voltage value.

4. A power controlling integrated circuit cell as claimed in claim 1, comprising a further control signal output and comprising a further control signal buffer at least partially powered from said unswitched power supply input and operable to drive a further control output signal from said further control signal output.

5. A power controlling integrated circuit cell as claimed in claim 4, comprising a further control signal input, said further control signal buffer being responsive to a further control input signal received at said further control signal input to drive said further control signal output.

6. A power controlling integrated circuit cell as claimed in claim 4, wherein said power control signal buffer circuit is operable in dependence on an enable signal, said further control signal buffer also being operable to receive said enable signal and being responsive to the enable signal being de-asserted to isolate the further control signal output.

7. A power controlling integrated circuit cell as claimed in claim 4, wherein said further control signal is one that must be driven when the switched power supply output is not connected to the unswitched power supply input.

8. A power controlling integrated circuit cell as claimed in claim 4, comprising a plurality of further control signals having respective further control signal buffers and further control signal outputs.

9. A power controlling integrated circuit cell as claimed in claim 1, wherein said power control signal input and said power control signal output are positioned at an outer edge of said integrated circuit cell such that and said power control signal input is connectable by abutment with a power control signal output of a neighboring power controlling integrated circuit cell.

10. A power controlling integrated circuit cell as claimed in claim 1, wherein said power control signal input is connectable via a linking conductor with a power control signal output of a neighboring power controlling integrated circuit cell.

11. An integrated circuit cell library element defining a power controlling integrated circuit cell as claimed in claim 1.

12. An integrated circuit comprising:
- a plurality of integrated circuit cells;
- a plurality of unswitched power supply lines;
- a plurality of switched power supply lines; and
- a plurality of power controlling integrated circuit cells, at least one of said power controlling integrated circuit cells having an unswitched power supply input, a switched power supply output, a power control signal input and a power control signal output and comprising:
  - a power switching circuit responsive to a power control input signal received at said power control signal input to selectively connect said switched power supply output to said unswitched power supply input; and
  - a power control signal buffer circuit at least partially powered from said unswitched power supply input and responsive to said switched power supply output to drive a power control output signal from said power control signal output;
- wherein for at least some of said plurality of power controlling integrated circuit cells:
- said unswitched power supply input is connected to one of said plurality of unswitched power supply lines;
- said switched power supply output is connected to one of said plurality of switched power supply lines; and
- a power control signal output of a given power controlling integrated circuit cell is connected to a power control signal input of another power controlling integrated circuit cell to provide a propagation path for a power control signal through said integrated circuit.

13. An integrated circuit as claimed in claim 12, wherein said propagation path is at least one of:
- a fan-out topology portion; and
- a daisy-chained topology portion.

14. An integrated circuit as claimed in claim 12, wherein said plurality of power controlling integrated circuit cells are positioned beneath said plurality of unswitched power signal lines.

15. An integrated circuit as claimed in claim 12, wherein the power switching circuit comprises first and second parallel switch elements, the first switch element being responsive to the power control input signal to selectively connect said switched power supply output to said unswitched power supply input, and the second switch element being responsive to the power control output signal to selectively connect said switched power supply output to said unswitched power supply input.

16. An integrated circuit as claimed in claim 12, wherein the connection of said switched power supply output to said unswitched power supply input by the power switching circuit will cause the voltage of the switched power supply output to transition over a period of time, and the power control signal buffer circuit is operable to produce a digital transition in the value of the power control output signal when the transitioning voltage of the switched power supply output reaches a predetermined voltage value.

17. An integrated circuit as claimed in claim 12, wherein said at least one power controlling integrated circuit cell comprises a further control signal output and comprises a further control signal buffer at least partially powered from said unswitched power supply input and operable to drive a further control output signal from said further control signal output.

18. An integrated circuit as claimed in claim 17, wherein said at least one power controlling integrated circuit cell comprises a further control signal input, said further control signal buffer being responsive to a further control input signal received at said further control signal input to drive said further control signal output.

19. An integrated circuit as claimed in claim 17, wherein said power control signal buffer circuit is operable in dependence on an enable signal, said further control signal buffer also being operable to receive said enable signal and being responsive to the enable signal being de-asserted to isolate the further control signal output.

20. An integrated circuit as claimed in claim 17, wherein said further control signal is one that must be driven when the switched power supply output is not connected to the unswitched power supply input.

21. An integrated circuit as claimed in claim 17, wherein said at least one power controlling integrated circuit cell provides a plurality of further control signals having respective further control signal buffers and further control signal outputs.

22. An integrated circuit as claimed in claim 12, wherein said power control signal input and said power control signal output are positioned at an outer edge of said power controlling integrated circuit cell such that said power control signal input is connectable by abutment with a power control signal output of a neighboring power controlling integrated circuit cell.

23. An integrated circuit as claimed in claim 12, wherein said power control signal input is connectable via a linking conductor with a power control signal output of a neighboring power controlling integrated circuit cell.

24. An integrated circuit as claimed in claim 12, wherein when said power control signal reaches an end of said propagation path, generation of a power control acknowledge signal is triggered.

25. A computer implemented method of designing an integrated circuit comprising the steps of:
- defining a power grid including a plurality of unswitched power supply lines and a plurality of switched power supply lines;
- locating a plurality of power controlling integrated circuit cells within said power grid, said plurality of power controlling integrated circuit cells having an unswitched power supply input, a switched power supply output, a power control signal input and a power control signal output, a power controlling integrated circuit cell comprising:
- a power switching circuit responsive to a power control input signal received at said power control signal input to selectively connect said switched power supply output to said unswitched power supply input; and
- a power control signal buffer circuit at least partially powered from said unswitched power supply input and responsive to said switched power supply output to drive a power control output signal from said power control signal output to provide a propagation path for a power control signal through said integrated circuit; and
- locating a plurality of further integrated circuit cells within said power grid, at least some portions of at least some of said further integrated circuit cells being powered from one of said plurality of switched power supply lines.

26. A computer implemented method as claimed in claim 25, wherein said propagation path is at least one of:
   a fan-out topology portion; and
   a daisy-chained topology portion.

27. A computer implemented method as claimed in claim 25, wherein said plurality of power controlling integrated circuit cells are positioned beneath said plurality of unswitched power signal lines.

28. A computer implemented method as claimed in claim 25, wherein the power switching circuit comprises first and second parallel switch elements, the first switch element being responsive to the power control input signal to selectively connect said switched power supply output to said unswitched power supply input, and the second switch element being responsive to the power control output signal to selectively connect said switched power supply output to said unswitched power supply input.

29. An integrated circuit as claimed in claim 25, wherein the connection of said switched power supply output to said unswitched power supply input by the power switching circuit will cause the voltage of the switched power supply output to transition over a period of time, and the power control signal buffer circuit is operable to produce a digital transition in the value of the power control output signal when the transitioning voltage of the switched power supply output reaches a predetermined voltage value.

30. A computer implemented method as claimed in claim 25, wherein at least one of said plurality of power controlling integrated circuit cells comprises a further control signal output and comprises a further control signal buffer at least partially powered from said unswitched power supply input and operable to drive a further control output signal from said further control signal output.

31. A computer implemented method as claimed in claim 30, wherein said at least one of said plurality of power controlling integrated circuit cells comprises a further control signal input, said further control signal buffer being responsive to a further control input signal received at said further control signal input to drive said further control signal output.

32. A computer implemented method as claimed in claim 30, wherein said power control signal buffer circuit is operable in dependence on an enable signal, said further control signal buffer also being operable to receive said enable signal and being responsive to the enable signal being de-asserted to isolate the further control signal output.

33. A computer implemented method as claimed in claim 30, wherein said further control signal is one that must be driven when the switched power supply output is not connected to the unswitched power supply input.

34. A computer implemented method as claimed in claim 30, wherein said at least one of said plurality of power controlling integrated circuit cells provides a plurality of further control signals having respective further control signal buffers and further control signal outputs.

35. A computer implemented method as claimed in claim 25, wherein said power control signal input and said power control signal output are positioned at an outer edge of said integrated circuit cell such that said power control signal input is connectable by abutment with a power control signal output of a neighboring power controlling integrated circuit cell.

36. A computer implemented method as claimed in claim 25, wherein said power control signal input is connectable via a linking conductor with a power control signal output of a neighboring power controlling integrated circuit cell.

37. A computer implemented method as claimed in claim 25, wherein when said power control signal reaches an end of said propagation path, generation of a power control acknowledge signal is triggered.

* * * * *